(12) United States Patent
Nakano et al.

(10) Patent No.: US 9,805,811 B2
(45) Date of Patent: Oct. 31, 2017

(54) SEMICONDUCTOR MEMORY DEVICE

(71) Applicants: Toshiba Memory Corporation, Minato-ku (JP); TOSHIBA INFORMATION SYSTEMS (JAPAN) CORPORATION, Kawasaki (JP)

(72) Inventors: Hiroaki Nakano, Kawaguchi (JP); Mami Kakoi, Yokohama (JP); Shigeki Nagasaka, Kawasaki (JP); Toshiyuki Kouchi, Kawasaki (JP); Itaru Yamaguchi, Yokohama (JP)

( * ) Notice: Subject to any disclaimer, the term of this patent is extended or adjusted under 35 U.S.C. 154(b) by 0 days.

(21) Appl. No.: 14/833,686

(22) Filed: Aug. 24, 2015

(65) Prior Publication Data

US 2016/0322112 A1  Nov. 3, 2016

Related U.S. Application Data

(60) Provisional application No. 62/153,866, filed on Apr. 28, 2015.

(51) Int. Cl.
*G11C 16/32* (2006.01)
*G11C 5/02* (2006.01)
*G11C 5/06* (2006.01)

(52) U.S. Cl.
CPC .......... *G11C 16/32* (2013.01); *G11C 5/025* (2013.01); *G11C 5/063* (2013.01)

(58) Field of Classification Search
CPC ...................................................... G11C 16/32

USPC ...................................................... 365/185.18
See application file for complete search history.

(56) References Cited

U.S. PATENT DOCUMENTS

| 7,746,719 | B2 | 6/2010 | Kang | |
|---|---|---|---|---|
| 8,593,891 | B2 | 11/2013 | Nishioka | |
| 2011/0057819 | A1* | 3/2011 | Ide | G11C 5/02 |
| | | | | 341/100 |
| 2011/0187429 | A1* | 8/2011 | Byeon | H03L 7/00 |
| | | | | 327/162 |
| 2012/0092943 | A1* | 4/2012 | Nishioka | G11C 16/20 |
| | | | | 365/191 |

FOREIGN PATENT DOCUMENTS

| JP | 10-125098 | 5/1998 |
|---|---|---|
| JP | 2009-026444 | 2/2009 |
| JP | 2012-083243 | 4/2012 |

* cited by examiner

*Primary Examiner* — Hoai V Ho
*Assistant Examiner* — Muna A Techane

(57) ABSTRACT

According to one embodiment, a semiconductor memory device includes a plurality of stacked first chips and a second chip. The second chip outputs a first signal to the first chips. The first chip outputs status information at timing based on the received first signal. The first chip shifts the received first signal and outputs the shifted first signal to the first chip of a next stage in synchronization with the first clock signal. The second chip receives a plurality of status information output in a serial manner from the first chips.

18 Claims, 8 Drawing Sheets

SEMICONDUCTOR MEMORY DEVICE

CROSS-REFERENCE TO RELATED APPLICATIONS

This application is based upon and claims the benefit of priority from U.S. Provisional Application No. 62/153,866, filed on Apr. 28, 2015; the entire contents of which are incorporated herein by reference.

FIELD

Embodiments described herein relate generally to semiconductor memory devices each including a nonvolatile semiconductor memory.

BACKGROUND

A technique for configuring one semiconductor memory device by stacking a plurality of memory core chips and one interface chip has been proposed. The interface chip is connected to the plurality of memory core chips through a bus and a control signal, and functions as an interface circuit between the plurality of memory core chips and a controller.

In such a semiconductor memory device, in order to check the statuses of the plurality of memory core chips, a status read command is transmitted from the interface chip to the plurality of memory core chips.

DETAILED DESCRIPTION

In general, according to one embodiment, a semiconductor memory device includes: a plurality of first chips; and a second chip. The first chip includes a memory cell array. The first chips are stacked. The second chip includes a first circuit that outputs a first signal to the first chips. The first chip includes a second circuit and a third circuit. The second circuit outputs status information at timing based on the first signal received from the second chip or a first signal received from the first chip of a previous stage. The third circuit shifts the first signal received from the second chip or the first chip of the previous stage and outputs the shifted first signal to the first chip of a next stage in synchronization with the first clock signal. The second chip includes a fourth circuit. The fourth circuit receives a plurality of status information output in a serial manner from the plurality of first chips in synchronization with the first clock signal.

Exemplary embodiments of a semiconductor memory device will be explained below in detail with reference to the accompanying drawings. The present invention is not limited to the following embodiments.

First Embodiment

Figure 1:
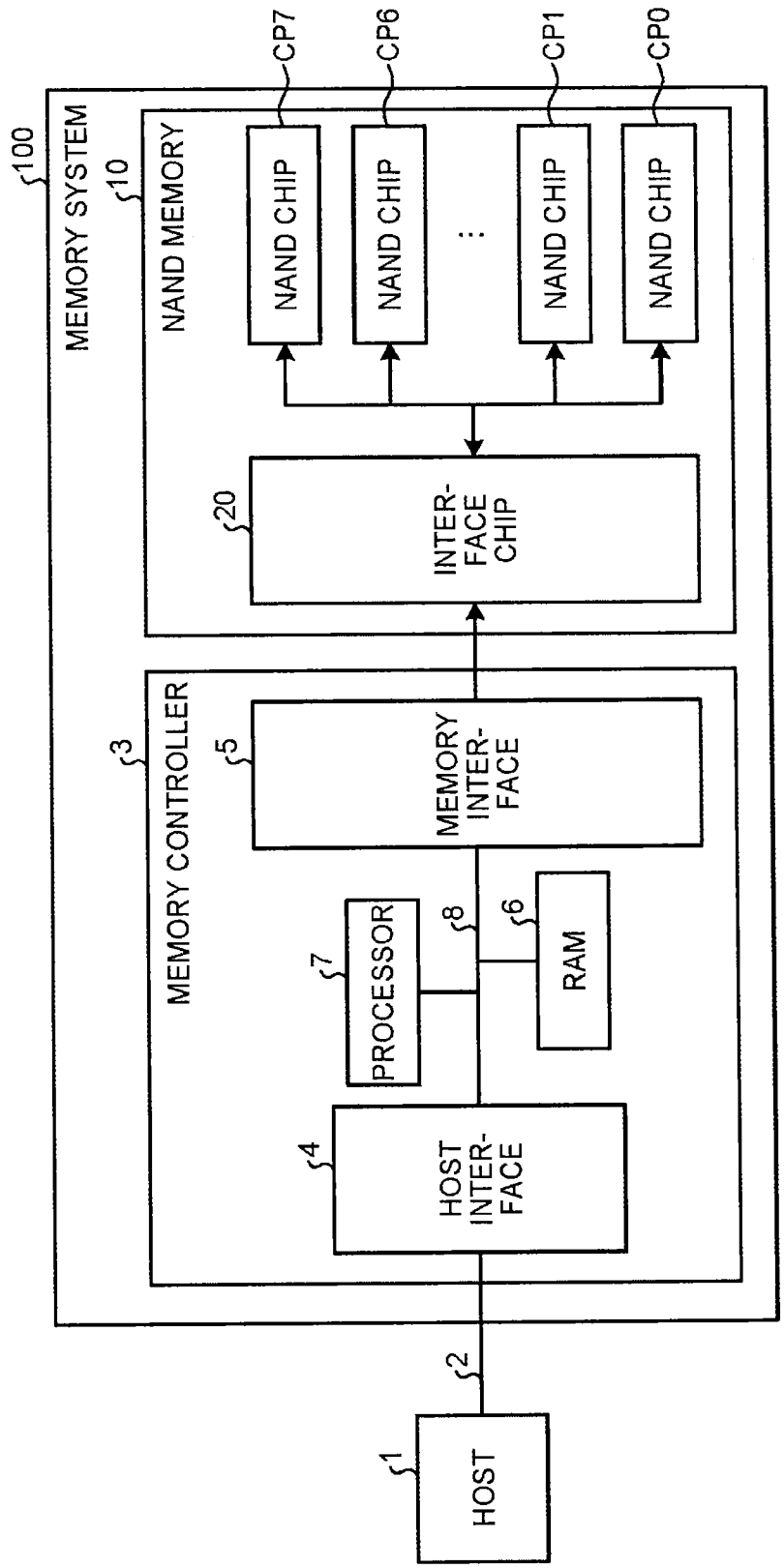
FIG. 1 is a functional block diagram that illustrates the internal configuration of a memory system.

FIG. 1 is a block diagram that illustrates an example of the configuration of a memory system 100. The memory system 100 is connected to a host apparatus (hereinafter, abbreviated as a host) 1 through a communication line 2 and functions as an external storage device of the host 1. The host 1, for example, may be an information processing apparatus such as a personal computer, a mobile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND memory) 10 as a nonvolatile semiconductor memory device; and a memory controller 3. The nonvolatile semiconductor memory device is not limited to the NAND flash memory but may be a flash memory having a three-dimensional structure, a resistance random access memory (ReRAM), a ferroelectric random access memory (FeRAM), or the like.

The memory controller 3 includes: a host interface 4; a memory interface 5; a RAM 6; a processor 7 that is operated by firmware; and the like.

The host I/F 4 outputs a command, user data (write data), and the like received from the host 1 to an internal bus 8. In addition, the host I/F 4 transmits user data and the like read from the NAND memory 10 to the host 1. As the host I/F 4, a serial advanced technology attachment (SATA), a PCI express (PCIe), a serial attached SCSI (SAS), or the like is employed. The memory I/F 5 directly controls the NAND memory 10 based on an instruction from the processor 7.

The RAM 6 is a volatile semiconductor memory that can be accessed at a speed higher than the speed of the NAND memory 10. The RAM 6 temporarily stores data received from the host 1 before writing the received data into the NAND memory 10 or temporarily stores data read from the NAND memory 10 before transmitting the read data to the host 1. In the RAM 6, the firmware stored in the NAND memory 10 or a ROM not illustrated is loaded.

The processor 7 executes write control, read control, or the like for the NAND memory 10 according to a command received from the host 1. In addition, the processor 7 executes block management, error correction control, garbage collection, wear leveling, and the like of the NAND memory 10.

The NAND memory 10 is configured by one or a plurality of memory packages. In this embodiment, the NAND memory 10 includes one memory package. The NAND memory 10 includes: one interface chip (hereinafter, referred to as an I/F chip) 20; and a plurality of memory core chips (hereinafter, referred to as NAND chips) CP0 to CP7. In this case, while eight NAND chips are assumed to be included, the number of NAND chips may be an arbitrary number of two or more.

Figure 2:
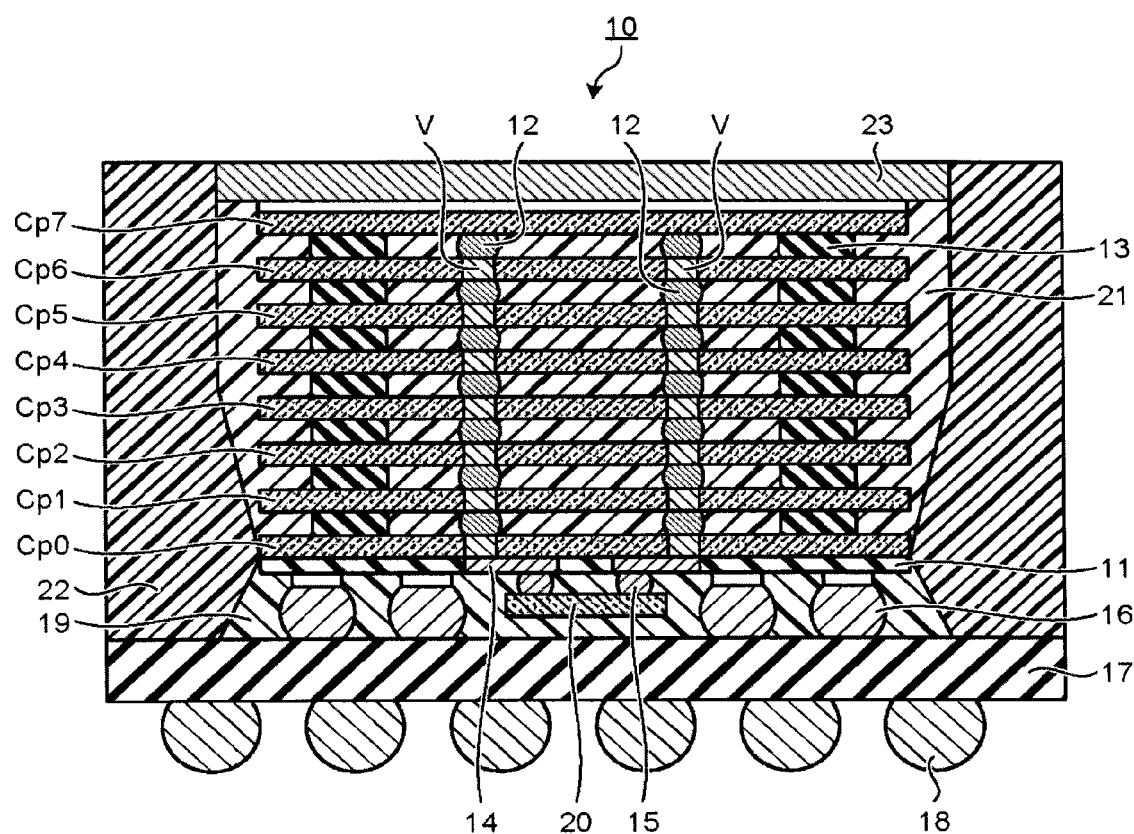
FIG. 2 is a cross-sectional view that illustrates an example of the configuration of a NAND memory package.

FIG. 2 is a cross-sectional view that illustrates an example of the configuration of the memory package configuring the NAND memory 10. As illustrated in FIG. 2, the NAND chips CP0 to CP7 are sequentially stacked. The NAND chips CP0 to CP7 are mounted on a support substrate 11. In each of the NAND chips CP0 to CP7, a plurality of through silicon vias (TSVs) V are arranged. Each through silicon vias V is connected between the NAND chips CP0 to CP7 through a solder ball 12. In addition, the NAND chips CP0 to CP7 are connected between upper and lower layers through an adhesive layer 13.

On the rear face of the support substrate 11, an I/F chip 20 is mounted. In the support substrate 11, wirings 14 are formed. The I/F chip 20 is connected to the wiring 14 through the solder ball 15. By connecting the through silicon via V of the NAND chip CP0 disposed on the lowermost layer to the wiring 14, the I/F chip 20 and the NAND chips CP0 to CP7 are electrically connected to each other. The support substrate 11 is connected to a mounting substrate 17 through a solder ball 16. On the rear face of the mounting substrate 17, a solder ball 18 connecting the mounting substrate 17 to the mother board is disposed. The I/F chip 20 is sealed by a sealing resin 19 on the mounting substrate 17. The NAND chips CP0 to CP7 are sealed by the sealing resin 21 on the support substrate 11. The outer peripheries of the sealing resins 19 and 21 are sealed by the sealing resin 22. The upper portion of the sealing resin 21 is sealed by a metal plate 23.

Figure 3:
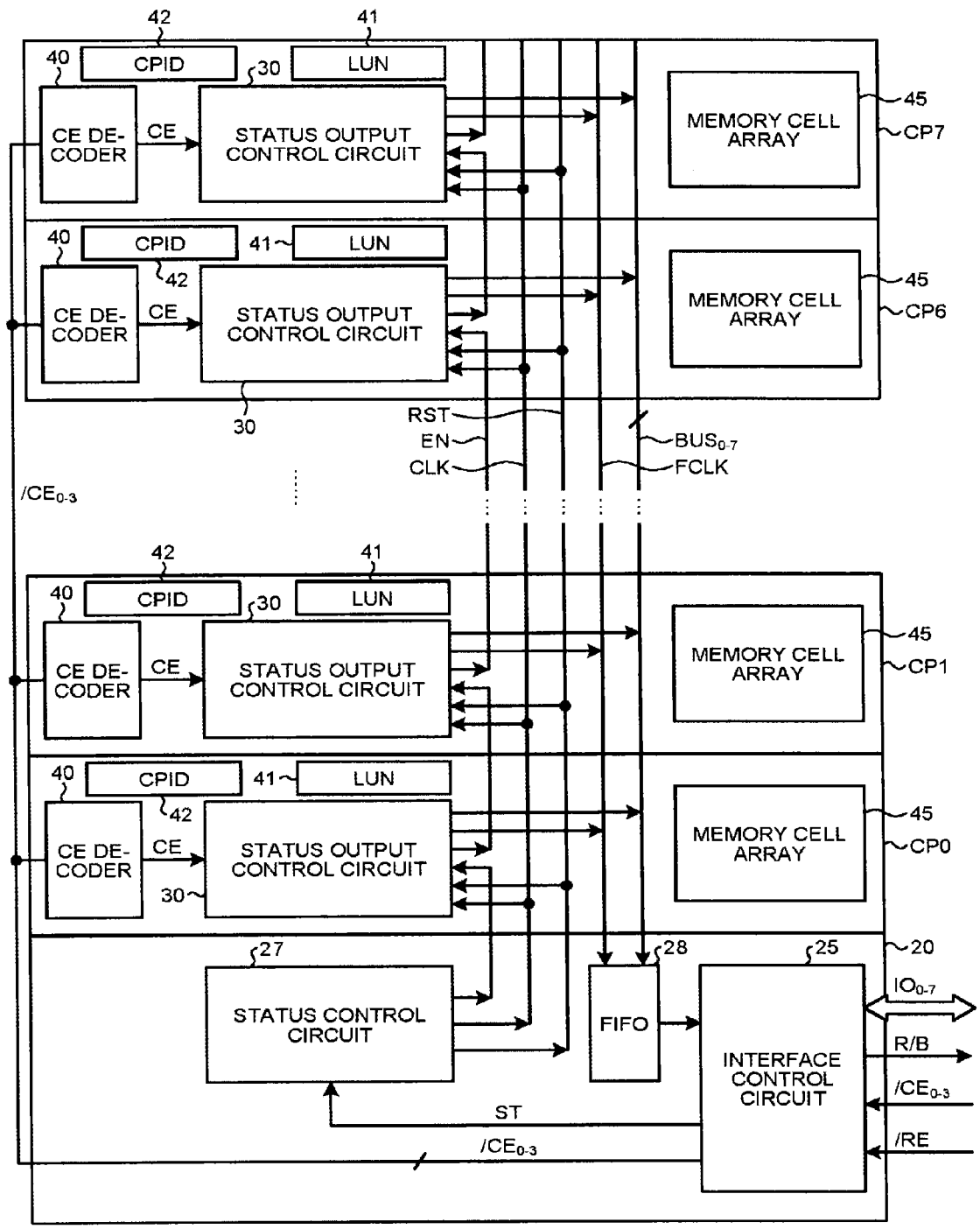
FIG. 3 is a functional block diagram that illustrates an example of the configuration of a NAND chip and an interface chip according to a first embodiment.

FIG. 3 is a diagram that illustrates an example of the functional configuration of the I/F chip 20 and the NAND chips CP0 to CP7. The I/F chip 20 includes: an interface control circuit (I/F control circuit) 25; a status control circuit 27; and an FIFO 28.

The I/F control circuit 25 is connected to the memory interface 5 of the memory controller 3 through control signal lines and IO signal lines. By using the IO signal lines IO0 to IO7, a command, an address, and data are transmitted and received between the memory interface 5 and the I/F control circuit 25. In the control signal lines, a plurality of chip enable signals /CE0 to /CE3, a ready/busy signal R/B, and a read enable signal /RE are included. In the control signal lines, while a command latch enable signal CLE, an address latch enable signal ALE, a write enable signal /WE, a write protect signal /WP, a data strobe signal DQS, and the like are included, such signals are not directly related to this embodiment, and thus, the signals are not illustrated. While the IO signal lines IO0 to IO7 are configured as eight bits, the number of bits thereof may be changed. In addition, the ready/busy signal R/B output from the I/F control circuit 25 to the memory controller 3 is in a busy state in a case where any NAND chip among the plurality of NAND chips CP0 to CP7 is busy.

The I/F control circuit 25 receives input of various control signals described above. The I/F control circuit 25 includes a buffer circuit that is used for transmitting/receiving the IO signals IO0 to IO7. The I/F control circuit 25 outputs the chip enable signals /CE0 to /CE3 to the plurality of NAND chips CP0 to CP7. When a status read command STRD (for example, 7Xh) is received through the IO signal lines IO0 to IO7, the I/F control circuit 25 outputs an operation start signal ST to the status control circuit 27. Here, "X" included in "7Xh" represents an arbitrary hexadecimal value of "0h" to "Fh". The I/F control circuit 25 transmits the status data STD of each NAND chip buffered in the FIFO 28 to the memory interface 5 through the I/F control circuit 25 based on a read enable signal /RE.

The I/F chip 20 and the plurality of NAND chips CP0 to CP7 are connected through a plurality of signal lines. The plurality of signal lines described above include: an enable signal line EN of one bit; chip enable signal lines /CE0 to /CE3 of a plurality of bits; a clock signal line CLK of one bit; an asynchronous reset signal line RST of one bit; a FIFO clock line FCLK of one bit; and IO buses BUS0 to BUS7. While the plurality of signal lines include signal lines relating to the command latch enable signal CLE, the address latch enable signal ALE, the write enable signal /WE, the write protect signal /WP, the data strobe signal DQS, and the like, the signal lines are not directly related to this embodiment and thus, are not illustrated here.

As illustrated in FIG. 2, some of the plurality of signal lines are formed by through silicon vias TSVs. The chip enable signal lines /CE0 to /CE3, the clock signal line CLK, the asynchronous reset signal line RST, the FIFO clock line FCLK, and the IO buses BUS0 to BUS7 are commonly connected between the I/F chip 20 and the NAND chips CP0 to CP7. On the other hand, the enable signal line EN is connected therebetween in the form of a daisy chain connection. In other words, the enable signal EN is input to a chip of a current stage from a chip (a chip adjacent to the lower side) of the previous stage, signal processing is executed signal by the status output control circuit 30 of the current stage, and then, the processed signal is output to a chip (a chip adjacent to the upper side) of the next stage.

The status control circuit 27 is started to operate by being triggered upon an operation start signal ST input from the I/F control circuit 25. The status control circuit 27 outputs an enable signal EN to the NAND chip CP0 of the lowermost stage (first stage). The status control circuit 27 commonly outputs an asynchronous reset signal RST and a clock signal CLK to the NAND chips CP0 to CP7.

The FIFO 28 includes FIFO-type registers of a plurality of stages. The FIFO 28 buffers status data STD that is sequentially output in a serial manner from the NAND chips CP0 to CP7 through the IO buses BUS0 to BUS7 in the registers based on FIFO clock signals FCLK output from the NAND chips CP0 to CP7. The FIFO 28 outputs the buffered status data STD to the I/F control circuit 25 in the buffered order.

The NAND chips CP0 to CP7 have the same internal configuration. Each of the NAND chips CP0 to CP7 includes: a status output control circuit 30; a CE decoder 40; a LUN register 41; and a CPID register 42. Each of the NAND chips CP0 to CP7 includes a memory cell array 45 and peripheral circuits (not illustrated in the figure) of the memory cell array 45. The peripheral circuits of the memory cell array include a row address buffer, a row decoder, a column address buffer, a column decoder, a data register, a sense amplifier, various registers, and the like.

The memory cell array 45 includes a plurality of memory cells arranged in a matrix pattern. Each memory cell can store a multi-value. The memory cell array 45 is configured by arranging a plurality of physical blocks that are units for data erasing. Each physical block is configured by a plurality of physical pages. The physical page is a minimal unit for data writing and data reading.

The CE decoder 40 decodes input chip enable signals /CE0 to /CE3 and outputs a result CE of the decoding process to the status output control circuit 30. The CE decoder 40 decodes the chip enable signals /CE0 to /CE3, determines whether or not its own NAND chip is enabled, and outputs a result CE of the determination to the status output control circuit 30.

Here, the manufacturer of the NAND memory 10 or the manufacturer of the memory system 100 can select and set a chip enable signal to be used among the plurality of chip enable signals /CE0 to /CE3. For example, in a case where one chip enable signal is selected, only the /CE0 is set to be valid, and the other /CE1 to /CE3 are set to be invalid. In a case where two chip enable signals are selected, the /CE0 and /CE1 are set to be valid, and the /CE2 and /CE3 are set to be invalid. In this embodiment, the /CE0 and /CE1 are set to be valid, and the /CE2 and /CE3 are set to be invalid. In such selection/setting information of chip enable is stored in registers (not illustrated) of the NAND chips CP0 to CP7.

In addition, each NAND chip stores chip identification information CPID used for identifying a stage of the memory package on which the NAND chip is positioned. For example, each NAND chip includes an increment circuit (not illustrated in the figure) that increments chip identification information transmitted from a chip of the previous stage by one, stores a result of the increment in the CPID register 42 as the chip identification information of the chip of the current stage in the CPID register 42, and transmits the result to a NAND chip of the next stage. Thus, when the power is turned on, the increment circuits are operated, and the chip identification information CPID of the chips are stored in the CPID registers 42 of the NAND chips CP0 to CP7.

In order to select one memory chip from among a plurality of memory chips included in a multi-chip package, the memory controller 3 uses a chip enable and a chip address CADD. The address signal that is input from the memory interface 5 to the NAND chips CP0 to CP7 of the NAND chips through the I/F control circuit 25, the IO signal lines IO0 to IO7, and the buses BUS0 to BUS7 includes a chip address CADD as a chip identification bit identifying the NAND chip, a row address, and a column address from the highest-order bit.

A logical unit number (LUN) is a target to be compared with the chip address CADD when one NAND chip is selected according to the chip address CADD from among a plurality of NAND chips selected by causing one chip enable signal to be assert (for example, /CE0). As a result of this comparison, a NAND chip in which an LUN coinciding with the chip address CADD is set in the LUN register 41 is selected.

For example, each of the NAND chips CP0 to CP7 includes an LUN setting circuit (not illustrated) that calculates LUN information of its own chip based on the selection/setting information of chip enable described above and sets the calculated LUN information in the LUN register 41 of the own chip when power is turned on. The LUN setting circuit increments the LUN setting value transmitted from the chip of the previous stage by one based on the selection/setting information of chip enable and the chip identification information CPID or executes nothing and calculates the LUN setting information of the current stage. Then, the LUN setting circuit transmits the calculated LUN setting information of the current stage to the NAND chip of the next stage.

Figure 4:
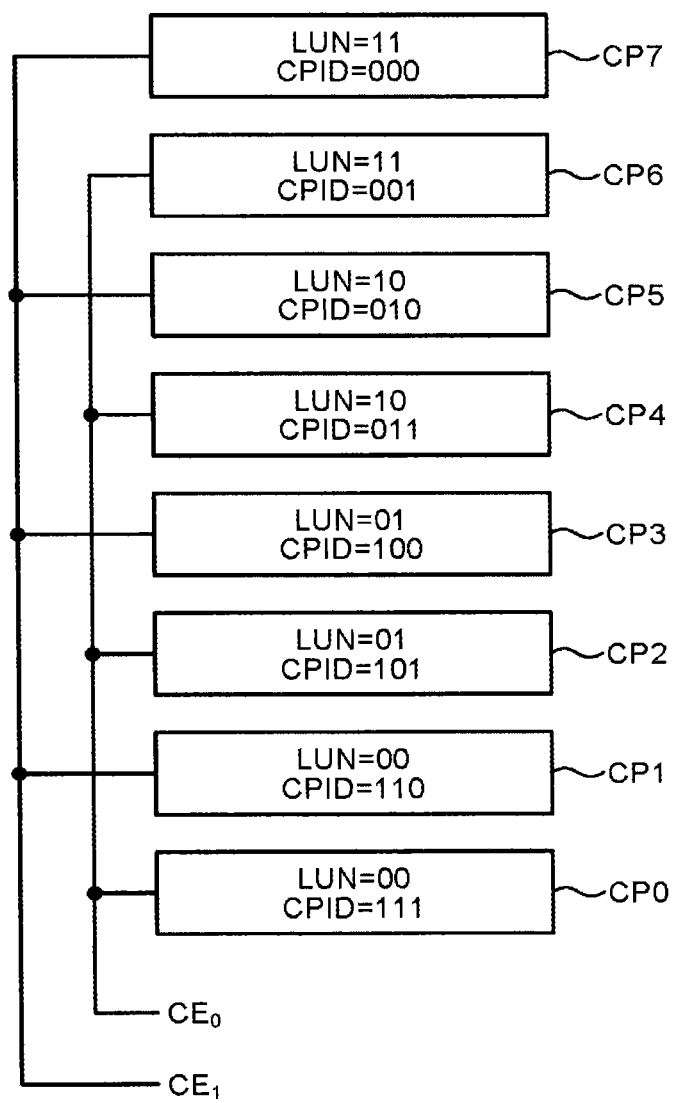
FIG. 4 is a diagram that illustrates an example of setting of a CE signal, a CPID, and a LUN in each NAND chip.

FIG. 4 illustrates an example of an equivalent connection form of the chip enable /CE0 and /CE1 and the setting values of the LUN registers 41 and the CPID registers 42 of the NAND chips CP0 to CP7 in a case where the selection of two chip enable from among the /CE0 to /CE3 is set as the selection/setting information of chip enable. In this setting, in terms of an equivalent circuit, the CE decoder 40 of each NAND chip is operated such that the chip enable /CE0 is commonly connected to the NAND chips CP0, CP2, CP4, and CP6, and the chip enable /CE1 is commonly connected to the NAND chips CP1, CP3, CP5, and CP7. In other words, the CE decoder 40 selects a chip enable corresponding to its own NAND chip from among the chip enable /CE0 to /CE4 connected to the input terminal and outputs the selected chip enable to the status output control circuit 30 as a decoded signal CE.

In the example illustrated in FIG. 4, in this case, the chip identification information CPID of the NAND chip CP7 disposed on the uppermost stage is set to "000", the chip identification information CPID of the NAND chip CP6 disposed second from the top is set to "001", and the chip identification information CPID of the NAND chip CP0 disposed on the lowermost stage is set to "111". In addition, the LUN of the NAND chip CP0 disposed on the lowermost stage is set to "00", and the LUN of the NAND chip CP1 disposed on the second stage is set to "00". The LUN of the NAND chip CP2 disposed on the third stage is set to "01", and the LUN of the NAND chip CP3 disposed on the fourth stage is set to "01". In addition, the LUN of the NAND chip CP4 disposed on the fifth stage is set to "10", and the LUN of the NAND chip CP5 disposed on the sixth stage is set to "10". Furthermore, the LUN of the NAND chip CP6 disposed on the seventh stage is set to "11", and the LUN of the NAND chip CP7 disposed on the eighth stage is set to "11".

Figure 5:
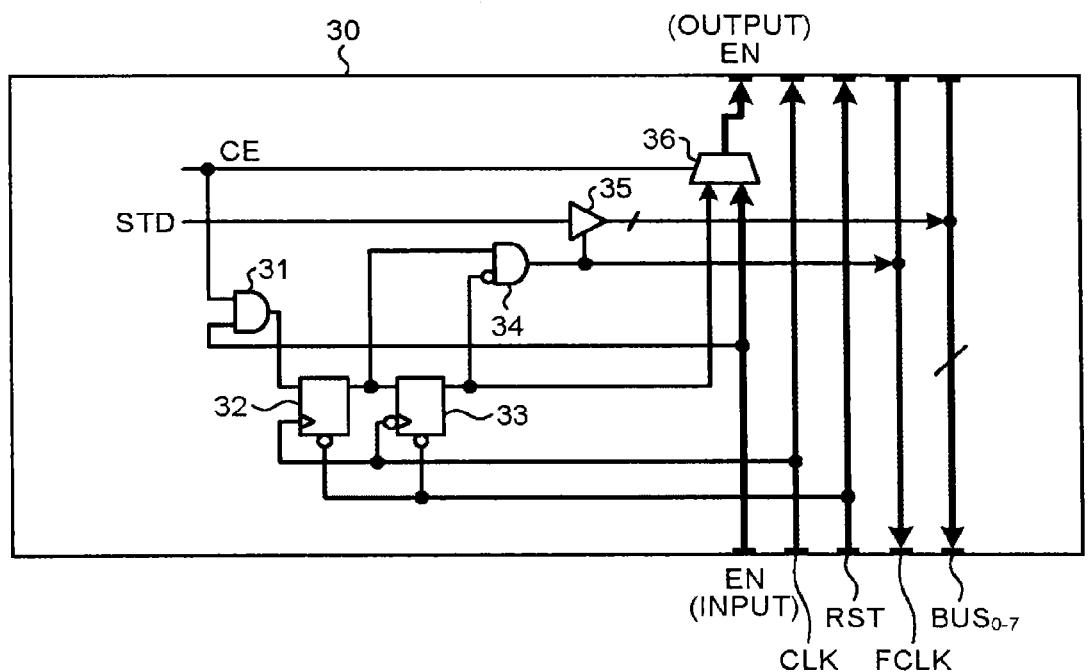
FIG. 5 is a circuit diagram that illustrates the internal configuration of a status output control circuit.

FIG. 5 illustrates an example of the internal configuration of the status output control circuit 30 of each of the NAND chips CP0 to CP7. An AND circuit 31 performs logical AND operation between a decoded signal CE output from the CE decoder and an enable signal EN input from the status control circuit 27 or the adjacent NAND chip disposed on the lower stage side and inputs an output thereof to the D terminal of a flip flop 32. An asynchronous reset signal RST is input to reset terminals of flip flops 32 and 33. A clock signal CLK is input to the clock terminal of the flip flop 32. An inverted signal of the clock signal CLK is input to the clock terminal of the flip flop 33. The output of the flip flop 32 is input to the D terminal of the flip flop 33 and the AND circuit 34. An inverted signal of the output of the flip flop 33 is input to the AND circuit 34. The output of the flip flop 33 is input to a selector 36. The flip flops 32 and 33 configure a shift register. Thus, the flip flop 33 delays the rise of the enable signal EN input to the flip flop 32 by one clock and outputs the delayed signal.

An AND circuit 34 perform logical AND operation between the output of the flip flop 32 and an inverted signal of the output of the flip flop 33 and outputs a FIFO clock signal FCLK that is the output thereof to the FIFO clock signal line FCLK and a gate circuit 35. The gate circuit 35 outputs the input status data STD to the buses BUS0 to BUS7 during a period in which the FIFO clock signal FCLK is assert. As described above, since the decoded signal CE is input to the AND circuit 31, when its own NAND chip is selected according to a chip enable signal /CE, the status data STD is output to the buses BUS0 to BUS7. The status data STD includes pass/fail information of a program process and an erase process, the ready/busy information R/B, the record protect information WP, and the like.

In a case where the decoded signal CE is assert, the selector 36 selects and outputs the output of the flip flop 33. In a case where the decoded signal CE is negate, the selector 36 selects and outputs an enable signal EN that is input from the adjacent NAND chip disposed on the lower stage side. In other words, in a case where the decoded signal CE is negate, the selector 36 selects an input for the flip flop 32 that configures a shift register. The output of the selector 36 is input to the adjacent NAND chip disposed on the upper stage side. By employing such a configuration of the selector, the rise of the enable signal EN is shifted by one clock only among a plurality of NAND chips sharing the chip enable signal /CE, and the enable signals are transmitted. In other words, through the NAND chip in which the decoded signal CE is negate, the enable signal EN passes and is input to the NAND chip disposed on the upper stage side.

Figure 6:
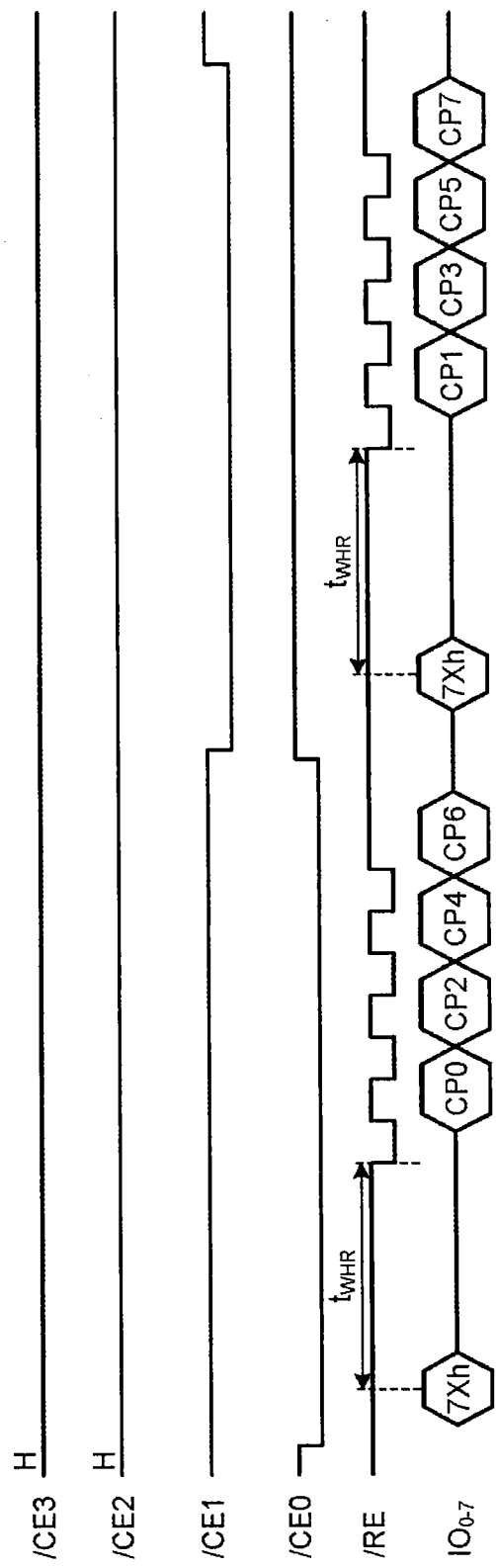
FIG. 6 is a timing diagram that illustrates various signals transmitted between a memory interface and the interface chip.

FIG. 6 illustrates a timing diagram of the chip enable signals /CE0 to /CE3, the read enable signal /RE, and the status read command STRD (for example, "7Xh") input from the memory interface 5 to the I/F control circuit 25 of the I/F chip 20. The status read command STRD is input through the IO signal lines IO0 to IO7. In this embodiment, as illustrated in FIG. 4, the /CE0 and /CE1 are set to be used, and the /CE2 and /CE3 are set not to be used, and accordingly, the /CE2 and /CE3 are fixed to negate (high).

First, the /CE0 becomes assert (low). Accordingly, as illustrated in FIG. 4, NAND chips CP0, CP2, CF4, and CP6 are selected from among the NAND chips CP0 to CP7 by the CE decoders 40 of the NAND chips. Next, a status read command STRD is issued from the memory interface 5. During a period tWHR that is a period until a read enable signal /RE becomes the low level after the issuance of the command STRD, the I/F chip 20 sequentially acquires the status data STD from the NAND chips CP0, CP2, CP4, and CP6. The acquired data is buffered in the FIFO 28. The I/F control circuit 25 sequentially outputs the status data STD of the NAND chips CP0, CP2, CP4, and CP6, which has been buffered in the FIFO 28, to the IO signal lines IO0 to IO7 in synchronization with timing at which the read enable signal /RE becomes the low level. Thereafter, the /CE0 becomes negate (high).

Next, the /CE1 becomes assert (low). Accordingly, as illustrated in FIG. 4, NAND chips CP1, CP3, CP5, and CP7 are selected from among the NAND chips CP0 to CP7. Next, a status read command STRD is issued from the memory interface 5. During the period tWHR, the I/F chip 20 sequentially acquires the status data STD from the NAND chips CP1, CP3, CP5, and CP7. The acquired data is buffered in the FIFO 28. The I/F control circuit 25 sequentially outputs the status data STD of the NAND chips CP1, CP3, CP5, and CP7, which has been buffered in the FIFO 28, to the IO signal lines IO0 to IO7 in synchronization with timing at which the read enable signal /RE becomes the low level. Thereafter, the /CE1 becomes negate (high).

Figure 7:
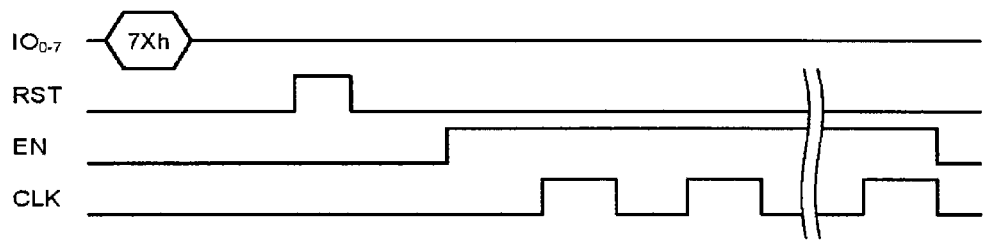
FIG. 7 is a timing diagram that illustrates various signals transmitted between the interface chip and the NAND chip.

FIG. 7 illustrates a timing diagram of the reset signal RST, the enable signal EN, and the clock signal CLK output from the status control circuit 27 of the I/F chip 20. As described above, when the status read command STRD is received through the IO buses IO0 to IO7, the I/F control circuit 25 outputs an operation start signal ST to the status control circuit 27. When this operation start signal ST is input, the status control circuit 27, first, outputs an asynchronous reset signal RST. Next, the status control circuit 27 outputs an enable signal EN. Next, the status control circuit 27 generates a required number of clock signals CLK during a period in which the enable signal EN is at the high level. The period in which the enable signal EN is assert, for example, is set based on the selection/setting information of chip enable described above and based on the number of NAND chips that are commonly connected to one chip enable and the period of the clock signal CLK.

Figure 8:
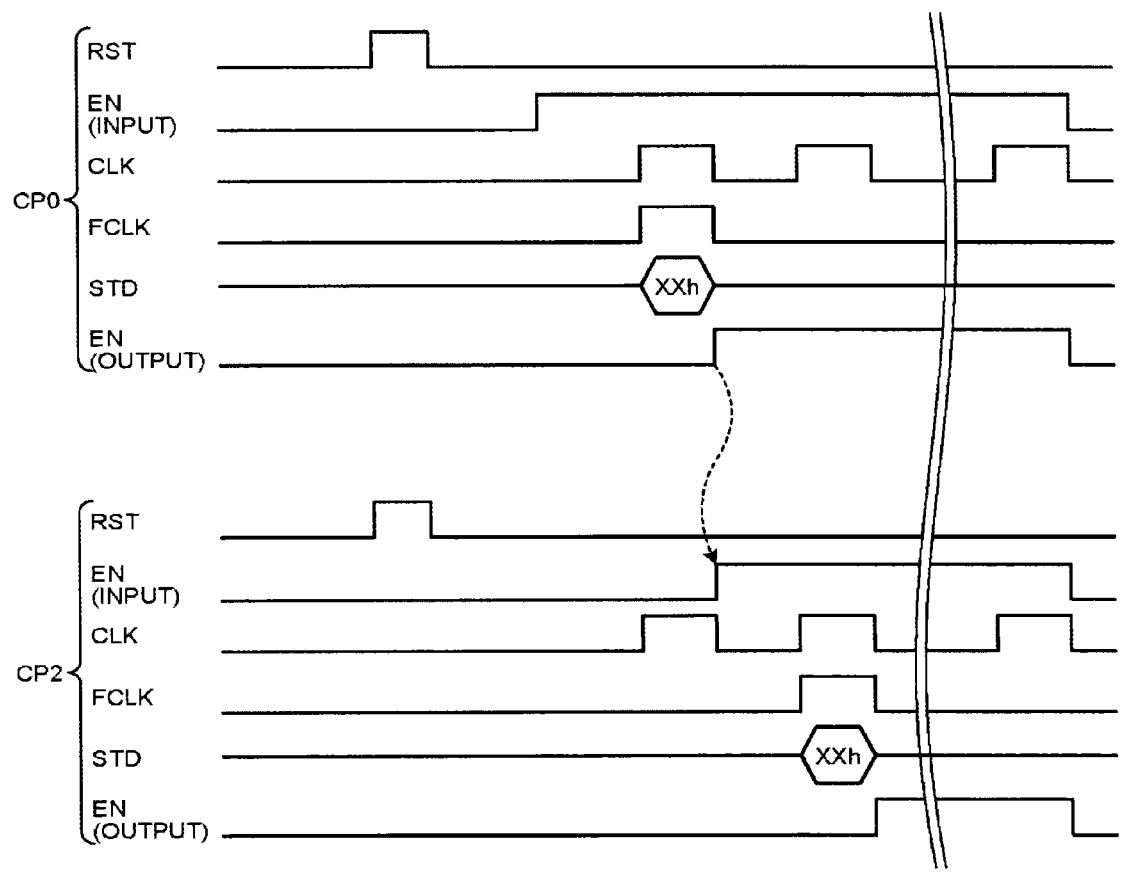
FIG. 8 is a timing diagram that illustrates various signals transmitted between NAND chips.

FIG. 8 illustrates a timing diagram of various signals input/output to/from the status output control circuit 30 of the NAND chip. A plurality of signals represented on the upper side in FIG. 8 illustrate a timing diagram relating to the NAND chip CP0, and a plurality of signals represented on the lower side in FIG. 8 illustrate a timing diagram relating to the NAND chip CP2. The NAND chips CP0 and CP2 share the chip enable /CE0 and, as illustrated in FIG. 4, are two chips disposed on the lower side among a plurality of NAND chips sharing the chip enable /CE0. While not illustrated in FIG. 8, the chip enable /CE0 is in the assert state.

When the reset signal RST becomes the high level, both the flip flops 32 and 33 disposed inside the status output control circuits 30 inside the NAND chips CP0 to CP7 are reset. An enable signal EN output from the status control circuit 27 of the I/F chip 20 is input to the status output control circuit 30 of the NAND chip CP0. In addition, after the enable signal EN is output from the status control circuit 27, a clock signal CLK is generated. The clock signal CLK is generated during a period in which the enable signal EN output from the status control circuit 27 is assert.

Since the decoded signal CE output from the CE decoder 40 of the NAND chip CP0 is assert, the AND circuit 31 of the NAND chip CP0 outputs a signal that is assert during the same period as that of the enable signal EN input to the NAND chip CP0. After the rise of the enable signal EN output from the status control circuit 27, a required number of clock signals CLK are input to the all the NAND chips. By taking logical AND of the output of the flip flop 32 and the inverted signal of the output of the flip flop 33, the AND circuit 34 generates a FIFO clock signal FCLK including a pulse that becomes the high level from the low level and becomes the low level from the high level at the same timing as that of the first clock signal CLK after the rise of the enable signal EN input from the chip of the previous stage. This FIFO clock FCLK is input to the FIFO 28 of the I/F chip 20 through the FIFO clock signal line FCLK.

When the FIFO clock FCLK is assert, the gate circuit 35 outputs the status information STD to the IO buses BUS0 to BUS7 of the NAND chip CP0. The FIFO 28 of the I/F chip 20 receives the status information STD of the NAND chip CP0 that is output from the gate circuit 35 of the NAND chip CP0 through the IO buses BUS0 to BUS7 based on the FIFO clock FCLK generated from the AND circuit 34 of the NAND chip CP0 and buffers the received status information.

In addition, the rise of the output of the AND circuit 31 is shifted by one clock by the flip flops 32 and 33 of the NAND chip CP0, and the shifted output is input to the selector 36. Since the decoded signal CE is assert, the selector 36 of the NAND chip CP0 outputs an enable signal EN acquired by shifting the rise of the enable signal EN output from the status control circuit 27 by one clock to the NAND chip CP1 of the next stage.

Since the decoded signal CE output from the CE decoder 40 is negate, the FIFO clock signal FCLK and the status information STD are not output from the NAND chip CP1. In addition, the selector 36 of the NAND chip CP1 causes the enable signal EN input from the NAND chip CP0 of the previous stage to pass it through and outputs the input enable signal to the NAND chip CP2 of the next stage.

The AND circuit 34 of the NAND chip CP2 generates a FIFO clock FCLK including a pulse that becomes the high level from the low level and becomes the low level from the high level at the same timing as that of the first clock signal CLK after the rise of the enable signal EN input from the NAND chip CP1 of the previous stage. This FIFO clock FCLK is input to the FIFO 28 of the I/F chip 20 through the FIFO clock signal line FCLK. When the FIFO clock FCLK is assert, the gate circuit 35 outputs the status information STD of the NAND chip CP2 to the IO buses BUS0 to BUS7. The FIFO 28 of the I/F chip 20 receives the status information STD of the NAND chip CP2 that is output from the gate circuit 35 of the NAND chip CP2 through the IO buses BUS0 to BUS7 based on the FIFO clock FCLK generated from the AND circuit 34 of the NAND chip CP2 and buffers the received status information.

In addition, the rise of the output of the AND circuit 31 is shifted by one clock by the flip flops 32 and 33 of the NAND chip CP2, and the shifted output is input to the selector 36. Since the decoded signal CE is assert, the selector 36 of the NAND chip CP2 outputs an enable signal EN acquired by shifting the rise of the enable signal EN output from the status control circuit 27 by two clocks to the NAND chip CP3 of the next stage.

Thereafter, similar processes are executed for the NAND chips CP3 to CP7. Accordingly, the FIFO 28 of the I/F chip 20, during the period tWHR illustrated in FIG. 6, acquires the status information STD of the NAND chips CP0, CP2, CP4, and CP6 in a serial manner in order of the LUN and buffers the acquired status information. As described above, the I/F control circuit 25 sequentially outputs the status data STD of the NAND chips CP0, CP2, CP4, and CP6, which has been buffered in the FIFO 28, to the IO signal lines IO0 to IO7 in synchronization with the timing at which the read enable signal /RE becomes the low level. As above, the output of the status information STD is executed in units of a plurality of NAND chips sharing the chip enable. In addition, according to the order of the output of the status information STD, a NAND chip disposed on the lower side is output first, and a NAND chip disposed on the upper side is output later. Thus, the order of the output of the status information STD is the order of the LUN.

As above, according to the first embodiment, when an enable signal EN is output once from the I/F chip 20, the status information is output from a plurality of NAND chips in predetermined order (for example, in order of the LUN). For this reason, relative to a technique outputting a status read command to each chip at the time of checking the status information of each NAND chip, a time required for reading the status can be shortened. In addition, according to the first embodiment, the status information can be acquired in units of a plurality of NAND chips sharing the chip enable. Furthermore, the status output control circuit 30 disposed inside each NAND chip can sequentially output the status information regardless of the number of stacked NAND chips, and a change in the number of stacked NAND chips can be responded without changing the circuit configuration of the status output control circuit 30.

In addition, in the embodiment, while the I/F chip 20 is disposed on the lowermost layer, and a plurality of NAND chips are stacked above the I/F chip, the I/F chip 20 may be disposed on the uppermost layer, and a plurality of NAND chips may be stacked below the I/F chip.

Second Embodiment

Figure 9:
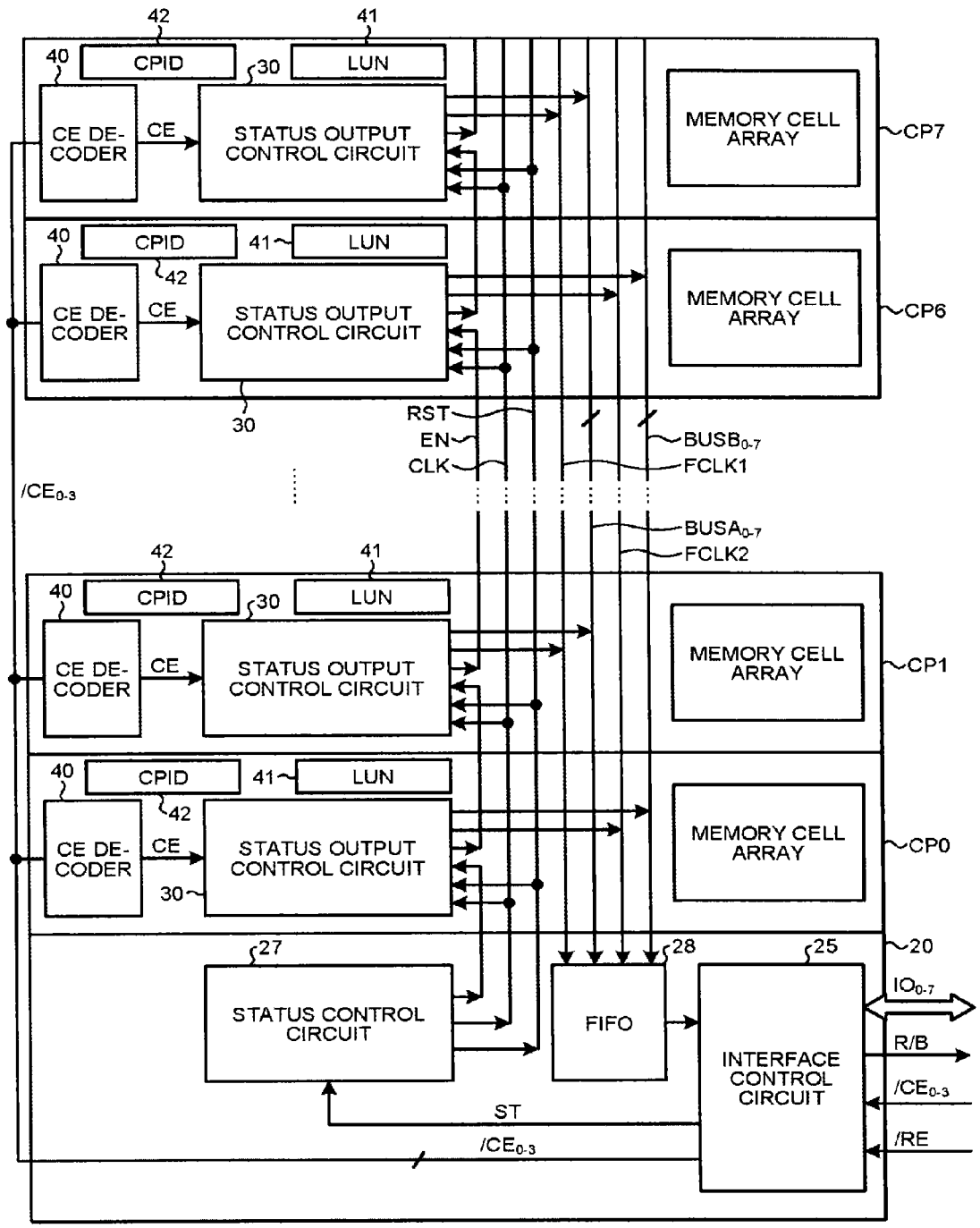
FIG. 9 is a functional block diagram that illustrates an example of the configuration of a NAND chip and an interface chip according a second embodiment.

FIG. 9 illustrates an example of the circuit configuration of a NAND memory 10 according to a second embodiment. As the number of NAND chips arranged inside the NAND memory 10 increases, a turnaround time until status information STD is received by the FIFO 28 after the output of an enable signal EN from the status control circuit 27 increases, and accordingly, the AC specification of the period tWHR illustrated in FIG. 6 is also lengthened. Thus, in the second embodiment, two sets of signal lines FCLK1 and FCLK2 for the FIFO clocks FCLK and two sets of IO buses BUSA0 to BUSA7 and BUSB0 to BUSB7 are included.

Among a plurality of NAND chips sharing a chip enable, switching between the two sets of signal lines FCLK1 and FCLK2 and the two sets of IO buses BUSA0 to BUSA7 and BUSB0 to BUSB7 is executed to be used. For example, in a case where a chip enable /CE0 is shared by the NAND chips CP0, CP2, CP4, and CP6, the NAND chips CP0 and CP4 use the signal line FCLK1 and the buses BUSA0 to BUSA7, and the NAND chips CP2 and CP6 use the signal line FCLK2 and the buses BUSB0 to BUSB7.

As above, according to the second embodiment, a plurality of sets (two or more sets) of communication buses are included, and thus, a high transmission speed can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first chips, each of the plurality of first chips including a memory cell array, the first chips being stacked in a multi-stage; and
   a second chip, the second chip including a first circuit that outputs, when a first command is received from a controller, a first signal to one of the plurality of first chips, the first command being a command for acquiring status information from the plurality of first chips, the plurality of first chins and the second chin being stacked, wherein
   each of the plurality of first chips includes:
   a third circuit that shifts, in synchronization with a first clock signal, the first signal received from the second chip or the first chip of a previous stage and outputs the shifted first signal to the first chip of a next stage, and
   a second circuit that outputs the status information at a timing based on the first signal received from the second chip or the shifted first signal received from the first chip of the previous stage, the status information including pass/fail information of a program process and an erase process to the memory cell array, ready/busy information, or record protect information; and
   the second chip includes a fourth circuit that receives, in a serial manner, a plurality of status information outputted from the plurality of first chips, in synchronization with the first clock signal.

2. The semiconductor memory device according to claim 1,
   wherein the first chips include one or a plurality of third chips and one or a plurality of fourth chips, the third chips sharing a first chip enable signal, the fourth chips sharing a second chip enable signal,
   a second circuit of the third chip outputs status information in a case where the first chip enable signal is assert,
   a second circuit of the fourth chip outputs status information in a case where the second chip enable signal is assert,
   the third chip further includes a fifth circuit, the fifth circuit selecting an output of the third circuit of the third chip in a case where the first chip enable signal is assert, selecting an input of the third circuit of the third chip in a case where the first chip enable signal is negate, and outputting the selected signal to the first chip of the next stage, and
   the fourth chip further includes a sixth circuit, the sixth circuit selecting an output of the third circuit of the fourth chip in a case where the second chip enable signal is assert, selecting an input of the third circuit of the fourth chip in a case where the second chip enable signal is negate, and outputting the selected signal to the first chip of the next stage.

3. The semiconductor memory device according to claim 2,
wherein the second chip includes a seventh circuit that outputs the first and second chip enable signals received from the controller to the plurality of first chips, and
the first chip includes eighth circuit that identifies whether the input first and second chip enable signals are signals for its own chip.

4. The semiconductor memory device according to claim 2, wherein the second circuit outputs the status information in synchronization with the first clock signal.

5. The semiconductor memory device according to claim 4,
wherein the second circuit further includes a ninth circuit that generates a second clock signal based on the first signal received from the second chip or the first signal received from the first chip of the previous stage and the first clock signal,
the second circuit outputs the status information by using the second clock signal as a trigger, and
the fourth circuit receives the status information based on the second clock signal.

6. The semiconductor memory device according to claim 5, wherein the third circuit includes:
a first flip flop that latches the first signal received from the second chip or the first chip of the previous stage based on the first clock signal; and
a second flip flop that latches an output of the first flip flop based on an inverted signal of the first clock signal.

7. The semiconductor memory device according to claim 6, wherein the ninth circuit is an AND circuit that performs logical AND operation between the output of the first flip flop and an inverted signal of an output of the second flip flop and outputs the second clock signal.

8. The semiconductor memory device according to claim 5, wherein the plurality of first chips include a plurality of through silicon vias for transmitting the first signal, the first and second clock signals, the status information, and the first and second chip enable signals.

9. The semiconductor memory device according to claim 5, comprising two or more sets of signal lines for transmitting the second clock signal and the status information.

10. A semiconductor memory device comprising a plurality of first chips, each of the plurality of first chips including a memory cell array,
wherein the first chip includes
a second circuit that shifts, in synchronization with a first clock signal, a first signal received from the first chip of the previous stage and outputs the shifted first signal to the first chip of a next stage
a first circuit that outputs status information at a timing based on the shifted first signal received from the first chip of the previous stage, the status information including pass/fail information of a program process and an erase process to the memory cell array, ready/ busy information, or record protect information.

11. The semiconductor memory device according to claim 10,
wherein the first chips include one or a plurality of third chips and one or a plurality of fourth chips, the third chips sharing a first chip enable signal, the fourth chip sharing a second chip enable signal, a first circuit of the third chip outputs the status information in a case where the first chip enable signal is assert,
a first circuit of the fourth chip outputs the status information in a case where the second chip enable signal is assert,
the third chip further includes a third circuit, the third circuit selecting an output of the second circuit of the third chip in a case where the first chip enable signal is assert, selecting an input of the second circuit of the third chip in a case where the first chip enable signal is negate, and outputting the selected signal to the first chip of the next stage, and
the fourth chip further includes a fourth circuit, the fourth circuit selecting an output of the second circuit of the fourth chip in a case where the second chip enable signal is assert, selecting an input of the second circuit of the fourth chip in a case where the second chip enable signal is negate, and outputting the selected signal to the first chip of the next stage.

12. The semiconductor memory device according to claim 11, wherein the first chip includes fifth circuit that identifies whether the input first and second chip enable signals are signals for its own chip.

13. The semiconductor memory device according to claim 12, wherein the first circuit outputs the status information in synchronization with the first clock signal.

14. The semiconductor memory device according to claim 13,
wherein the first circuit further includes a sixth circuit that generates a second clock signal based on the first signal received from the first chip of the previous stage and the first clock signal, the second clock signal being a signal for receiving the status information, and
the first circuit outputs the status information by using the second clock signal as a trigger.

15. The semiconductor memory device according to claim 14, wherein the second circuit includes:
a first flip flop that latches the first signal received from the first chip of the previous stage based on the first clock signal; and
a second flip flop that latches an output of the first flip flop based on an inverted signal of the first clock signal.

16. The semiconductor memory device according to claim 15, wherein the sixth circuit is an AND circuit that performs logical AND operation between the output of the first flip flop and an inverted signal of an output of the second flip flop and outputs the second clock signal.

17. The semiconductor memory device according to claim 14, wherein the plurality of first chips include a plurality of through silicon vias for transmitting the first signal, the first and second clock signals, the status information, and the first and second chip enable signals.

18. A semiconductor memory device comprising:
a first chip, a second chip, and a third chip, the second chip including a first memory cell array, the third chip including a second memory cell array, the first, second, and third chips being stacked; wherein
the first chip includes a first circuit that outputs, when a first command is received from a controller, a first signal to the second chip;
the second chip includes:
a second circuit that shifts, in synchronization with a first clock signal, the first signal received from the first chip and outputs the shifted first signal to the third chip, and a third circuit that outputs first status information at timing based on the first signal received from the first chip;

the third chip includes:

a fourth circuit that shifts, in synchronization with the first clock signal, the shifted first signal received from the second chip, and a fifth circuit that outputs second status information at timing based on the shifted first signal received from the second chip; and the first chip further includes:

a sixth circuit that receives, in a serial manner, the first status information outputted from the second chip and the second status information outputted from the third chip.

* * * * *

UNITED STATES PATENT AND TRADEMARK OFFICE
CERTIFICATE OF CORRECTION

PATENT NO. : 9,805,811 B2  
APPLICATION NO. : 14/833686  
DATED : October 31, 2017  
INVENTOR(S) : Hiroaki Nakano et al.

Page 1 of 1

It is certified that error appears in the above-identified patent and that said Letters Patent is hereby corrected as shown below:

On the Title Page

Item (73), the Assignees' Information has been omitted. Item (73) should read:
--(73) Assignees: TOSHIBA MEMORY CORPORATION, Minato-ku (JP);
TOSHIBA INFORMATION SYSTEMS (JAPAN) CORPORATION, Kawasaki-city (JP)--

Signed and Sealed this
Twenty-eighth Day of May, 2019

Andrei Iancu
*Director of the United States Patent and Trademark Office*